US006862662B1

(12) United States Patent
Cloud (10) Patent No.: US 6,862,662 B1
(45) Date of Patent: Mar. 1, 2005

(54) HIGH DENSITY STORAGE SCHEME FOR SEMICONDUCTOR MEMORY (75) Inventor: Eugene H. Cloud, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/518,338

(22) Filed: Mar. 3, 2000

(51) Int. Cl.$^7$ .............................................. G06F 12/00
(52) U.S. Cl. ............................ 711/118; 711/3; 711/113; 711/201
(58) Field of Search ........................... 711/3, 113, 118, 711/170, 201; 710/65–68

(56) References Cited

U.S. PATENT DOCUMENTS

| 5,574,879 | A | * | 11/1996 | Wells et al. ................ 711/100 |
| 5,761,536 | A | * | 6/1998 | Franaszek .................... 710/68 |
| 6,145,069 | A | * | 11/2000 | Dye ............................ 345/501 |
| 6,175,896 | B1 | * | 1/2001 | Bui ............................. 711/118 |
| 6,279,092 | B1 | * | 8/2001 | Franaszek et al. .......... 711/170 |
| 6,295,618 | B1 | | 9/2001 | Keeth ........................ 714/718 |
| 6,341,325 | B2 | * | 1/2002 | Franaszek et al. ............ 711/3 |
| 6,343,354 | B1 | * | 1/2002 | Breternitz, Jr. et al. ..... 711/201 |
| 6,349,372 | B1 | * | 2/2002 | Benveniste et al. ......... 711/159 |
| 6,353,871 | B1 | * | 3/2002 | Benveniste et al. ............ 711/3 |

* cited by examiner

Primary Examiner—T. Nguyen
(74) Attorney, Agent, or Firm—Schwegman, Lundberg, Woessner & Kluth, P.A.

(57) ABSTRACT

A memory device comprising a compression and decompression engine and a error detection and correction engine connected between a cache memory and a main memory in the same semiconductor chip.

38 Claims, 6 Drawing Sheets

HIGH DENSITY STORAGE SCHEME FOR SEMICONDUCTOR MEMORY

TECHNICAL FIELD OF THE INVENTION

The present invention relates generally to semiconductor memory and in particular to data compression and decompression in a dynamic random access memory device.

BACKGROUND OF THE INVENTION

Semiconductor memory devices such as dynamic random access memory (DRAM) devices are widely used to store data in computers and electronic products. One important criterion in a DRAM device is storage density. As semiconductor technology advances, designers strive to design new generation of DRAM device with a higher storage density.

There are many methods used in designing a DRAM device to achieve a higher density. One method is reducing the size of each of millions of cells in a DRAM device thus increasing the number of cells and consequently increasing the overall storage density of the device. Another method is stacking the cells vertically, this in effect, doubles the storage capacity. There are other methods of designing a DRAM device to achieve high storage density.

There is a need for a method to achieve even higher storage density for a DRAM device using other techniques.

SUMMARY OF THE INVENTION

The present invention increases a storage density of a semiconductor memory device. In particular, the invention includes an apparatus and method of compressing and decompressing data in a DRAM device.

In one embodiment of the invention, the memory device includes a main memory, an input/output buffer, a cache memory connected between the main memory and the input/output buffer, and a compression and decompression engine connected between the main memory and the cache memory.

In another embodiment of the invention, the memory device includes a main memory, a cache memory connected to the main memory, a compression and decompression engine connected to the main memory and the cache memory, and an error detection and correction engine connected to the main memory and the compression and decompression engine.

Yet another embodiment of the invention provides a method of increasing a storage density of a memory device. The method comprises forming a main memory in a semiconductor chip, forming a cache memory, forming a compression and decompression engine in the same chip, and connecting the compression and decompression engine between the main memory and the cache memory.

DETAILED DESCRIPTION OF THE INVENTION

The following detailed description of the preferred embodiments refers to the accompanying drawings which form a part hereof, and shows by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
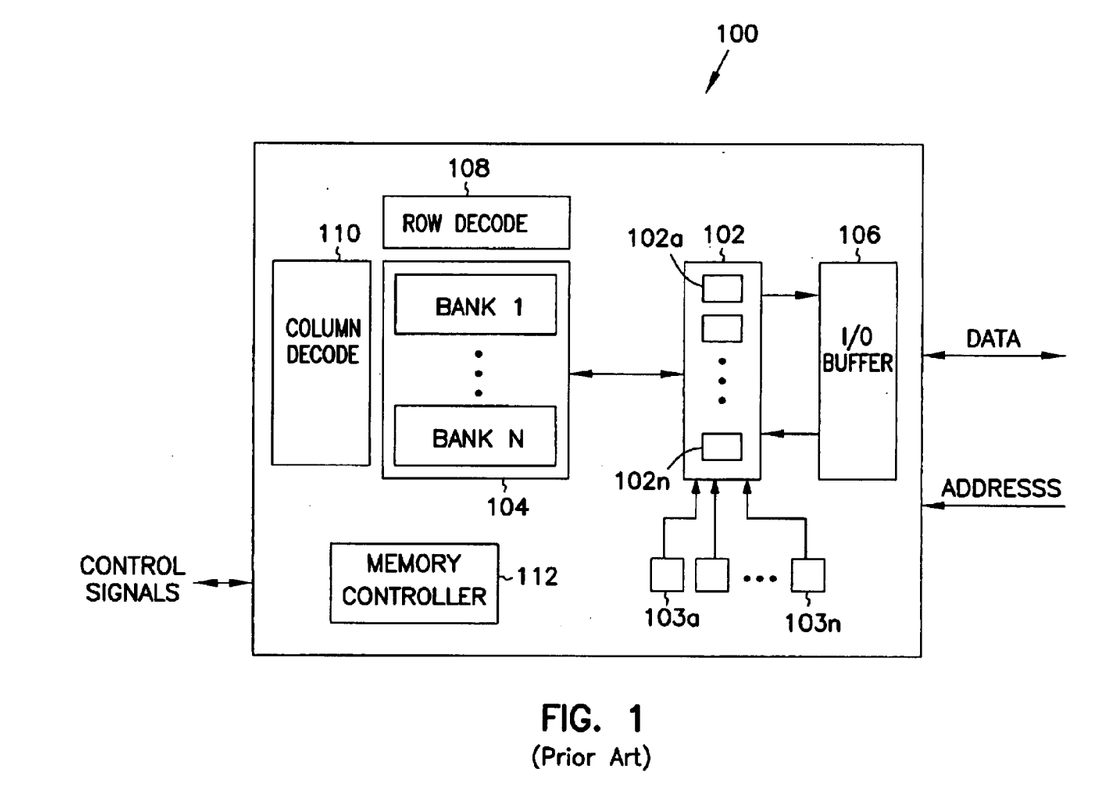
FIG. 1 illustrates a prior art a memory device.

FIG. 1 illustrates a prior art a memory device 100. Memory device 100 includes a cache memory 102 connected between a main memory 104, and an input/output (I/O) buffer 106. Main memory 104 typically comprises dynamic random access memory (DRAM) devices and comprises one or more memory banks, indicated by BANK 1-N. Each of the memory banks BANK 1-N comprises a plurality of memory cells arranged in rows and columns. Row decode circuit 108 and column decode circuit 110 access the rows and columns in response to an address, provided on address bus (ADDRESS) by an external controller, such as a microprocessor. I/O data buffers 106 connects to data communication lines (DATA) for bi-directional data communication with main memory 104. A memory controller 112 controls data communication between the memory 100 and external devices by responding to control signals (CONTROL SIGNALS).

Cache memory 102 comprises a plurality of fast static registers or channels, such as channels 102a–n. Each of the channels 102a–n is controlled by a channel controller, indicated by 103a–n. Because each of the channels 102a–n has its own controller, the channel 102a–n operates independently from each other and provide fast access paths between main memory 104 and I/O buffer 106. The independent operation and fast access path of each of the channels collectively result in a higher memory bus bandwidth and reduced data access latency of the memory device. A memory device which includes a cache memory such as that of memory device 100 is commonly referred to as virtual channel memory (VCM) device.

Figure 2:
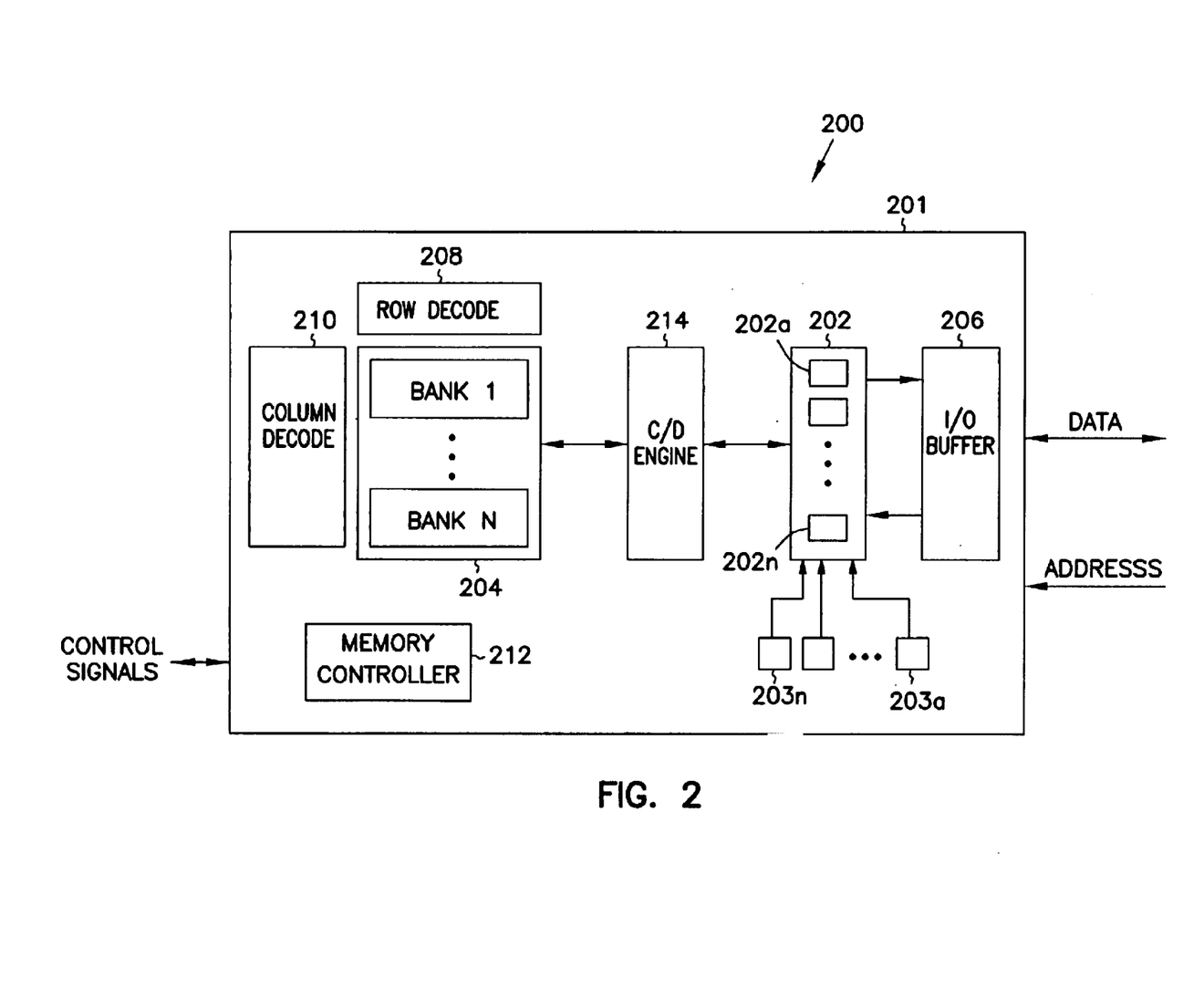
FIG. 2 illustrates a memory device of the present invention.

FIG. 2 illustrates a memory device 200 of the invention. Memory device 200 comprises a memory chip 201. Memory device is similar to memory device 100 of FIG. 1 with an exception of an additional feature indicated by a compression and decompression (C/D) engine 214. C/D engine 214 itself is well known to those skilled in the art. C/D engine 214 is connected between a main memory 204 and a cache memory 202 which is connected to an I/O buffer 206. Main memory comprises one or more addressable memory banks, indicated by BANK 1-N. Each of the memory banks BANK 1-N comprises a plurality of memory cells arranged in rows and columns. Row decode circuit 208 and column decode circuit 210 access the rows and columns in response to an address, provided on address bus (ADDRESS) by an external controller, such as a microprocessor. I/O data buffers 206 connects to data communication lines (DATA) for bi-directional data communication with main memory 204. In addition, a memory controller 212 controls data communication between the memory 200 and external devices by responding to control signals (CONTROL SIGNALS).

Cache memory 202 may be selected from any type of memory but usually a static random access memory (SRAM) and normally operates at a faster speed than main memory 204, which is typical a dynamic random access memory (DRAM). Cache memory 202 may comprise one or more registers or channels as indicated in the Figures as channels 206a–n. Each of the channels is controlled by a channel controller 203a–n.

The inclusion of C/D engine 214 in a single chip, chip 201, with main memory 204 and cache memory 202 is practicable in this memory device because cache memory 204, having reduced data access latency, would hide or compensate any data access latency associated with C/D engine 214. Furthermore, the inclusion of C/D engine on the same chip with the main memory and the cache memory increases the operational speed of the memory device by eliminating off-chip drivers and connections.

As its name indicates, a C/D engine is a device which compresses and decompresses data using a hardware encoding scheme such as a Lempel Ziv encoding or other industry standard encoding schemes. One advantage of using a C/D engine, such as C/D engine 214, in a DRAM device is that data is compressed through the C/D before it enters main memory 204. This in effect increases a storage density of main memory 214.

In operation, I/O buffer 206 receives data from data communication lines DATA. Cache memory 202 processes the data and produces processed data. C/D engine 214 receives the processed data from cache memory 202 and compresses the data before it is stored or written into main memory 204. The data stored in main memory 204 can be read and decompressed.

Figure 3:
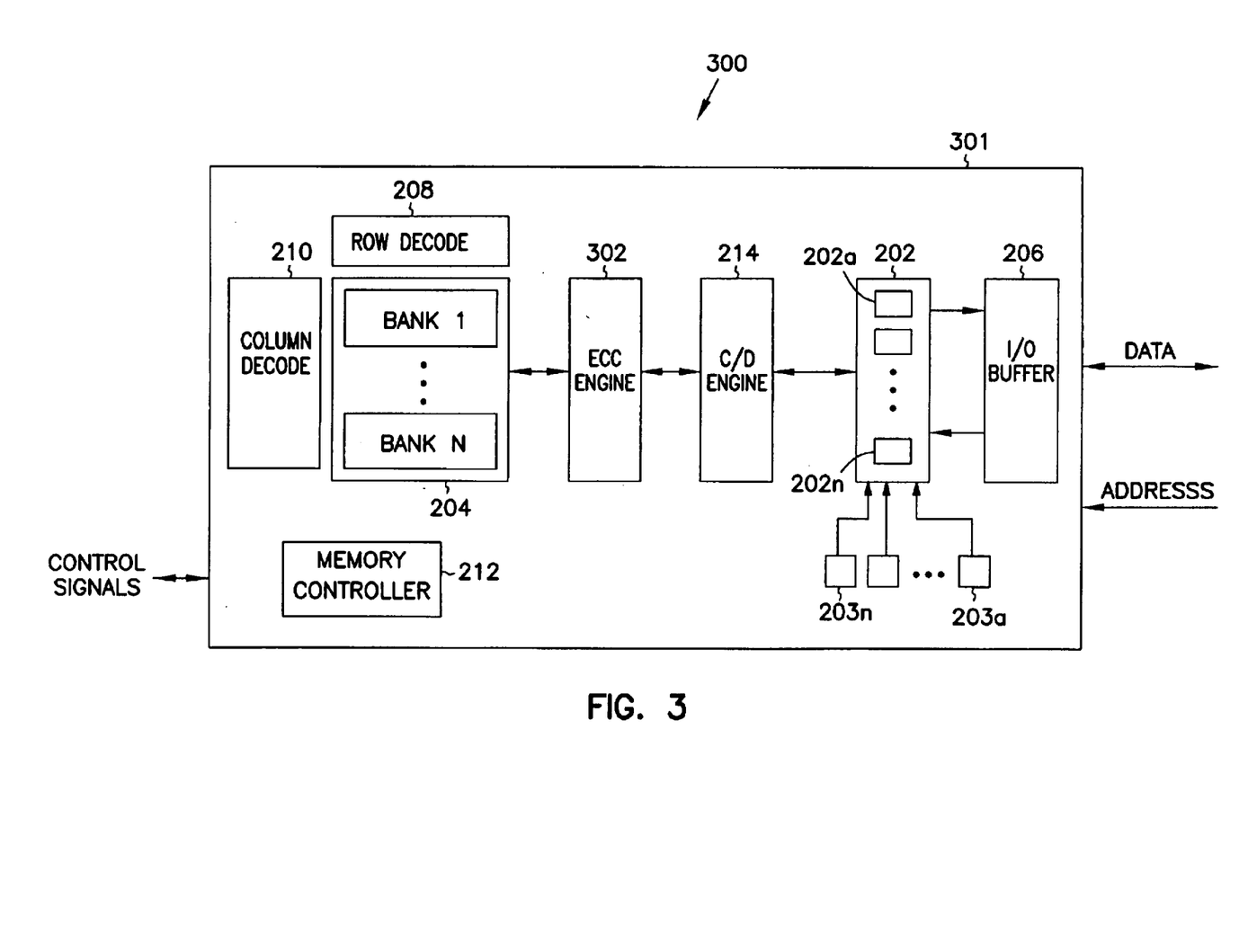
FIG. 3 illustrates a memory device of FIG. 2 including an error detection and correction (ECC) engine.

FIG. 3 illustrates another memory device according to the invention. Memory device 300 is similar to memory 200 of FIG. 2 with the exception of an error detection and correction (ECC) engine 302. ECC engine 302 is connected between C/D engine 214 and main memory 204. As in the case with the C/D engine, several types of ECC engines are well known to those skilled in the art. ECC engine 302, in memory device 300 will ensure the accuracy of data without substantially compromising a functional operation of the memory device, such as speed or latency, because cache memory 214 would reduce or compensate any latency which the ECC engine may produce. Furthermore, all the components of memory device 300 in FIG. 3 are in a single chip, indicated by chip 301.

An ECC engine is a device which performs a process of detecting for error and correcting the error to ensure the accuracy and integrity data during a data transmission. Any ECC engine using Hamming Code, Reed-Solomon Code or other techniques can be used as ECC engine 302 in memory device 300 of the invention.

The inclusion of the C/D engine and the ECC engine in a memory device of the present invention as described above is not limited to memory devices having a cache memory or virtual channel memory. The C/D and the ECC engines may also be included in other memory devices including, but not limited to Double Data Rate synchronous DRAM (DDR SDRAM) or DRAM devices similar to RDRAM (TM) made by Rambus (TM) corporation.

Figure 4:
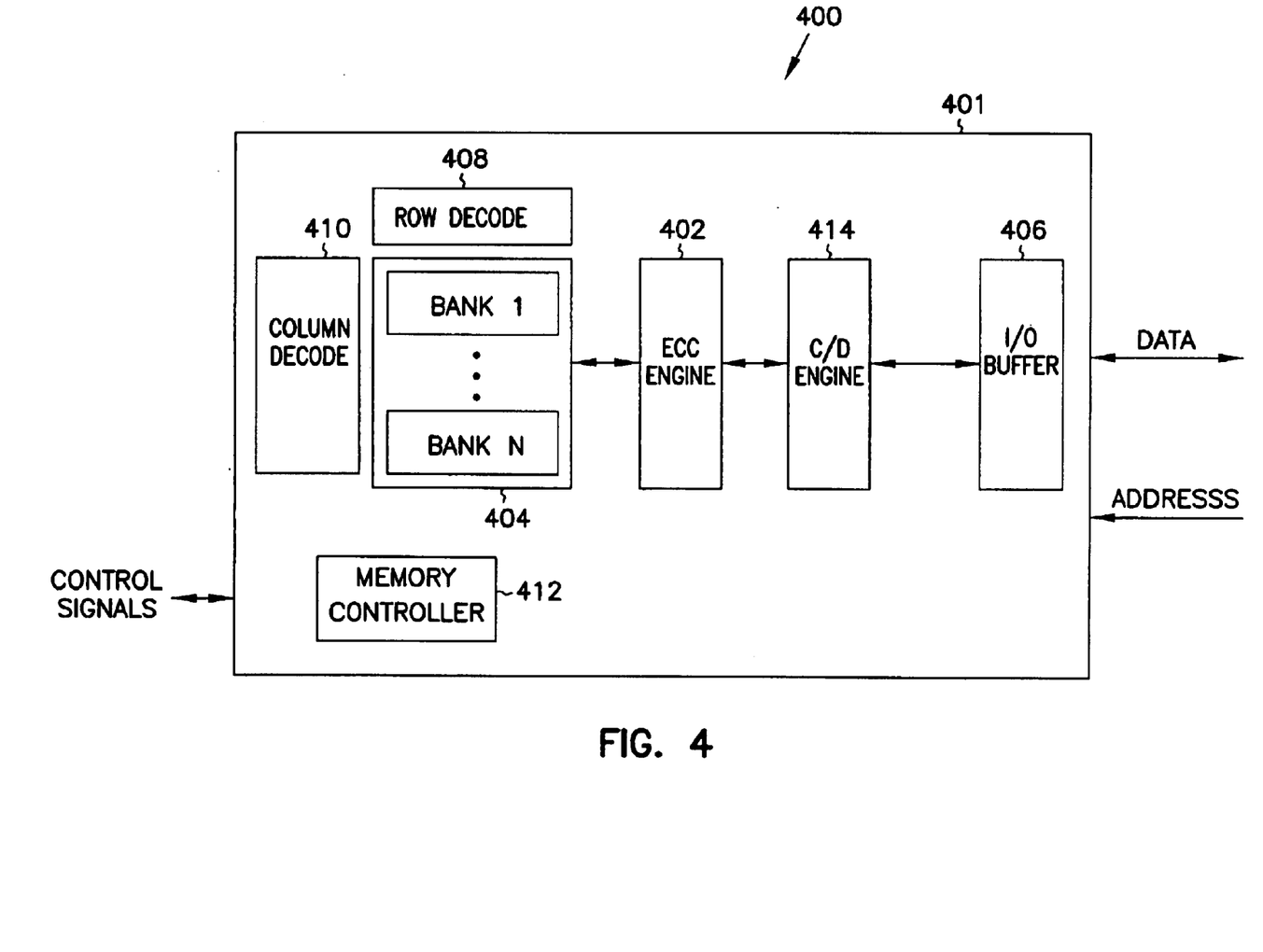
FIG. 4 illustrates another embodiment of a memory device.

FIG. 4 illustrates a memory device of the invention having a C/D and the ECC engines included in a DRAM device other than a virtual channel memory device. Memory device 400 may be a DDR SDRAM device or an RDRAM (TM) device with the exception of C/D engine 414 and the ECC engine 402 connected between a main memory 404 and I/O buffer 406. Main memory comprises one or more addressable memory banks, indicated by BANK 1-N. Each of the memory banks BANK 1-N comprises a plurality of memory cells arranged in rows and columns. Row decode circuit 408 and column decode circuit 410 access the rows and columns in response to an address, provided on address bus (ADDRESS) by an external controller, such as a microprocessor. I/O data buffers 406 connect to data communication lines (DATA) for bi-directional data communication with main memory 404. A memory controller 412 controls the operation of the memory via control signals, indicated as CONTROL SIGNALS. In addition, all the components of memory device 400 are in a single chip, indicated by chip 401.

Figure 5:
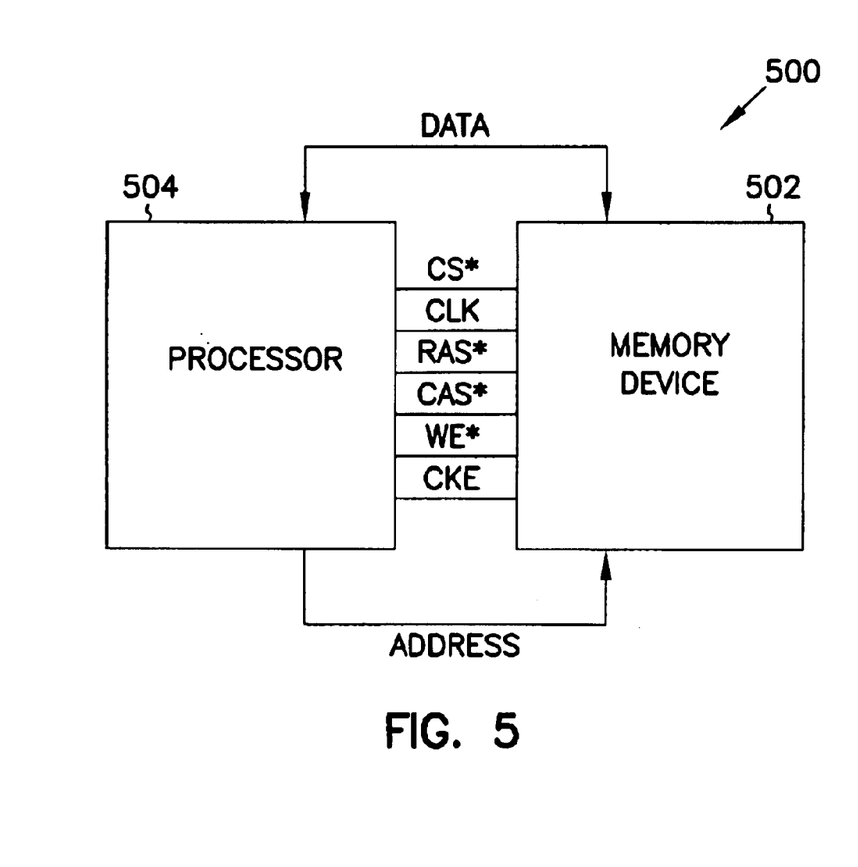
FIG. 5 illustrates a computer system incorporating the memory devices of FIGS. 2–4.

FIG. 5 illustrates a system 500 which includes a memory device 502 connected to an external processor 504. Memory device 502 may be one or more of any of the memory devices of the present invention described above. Memory 502 communicates with processor 504 via an address bus (ADDRESS) and a data bus (DATA) and control signals which include, but are not limited to, a Chip Select (CS*), a Clock (CLK), Row Access Strobe (RAS*), Column Access Strobe (CAS*), Write Enable (WE*), Clock Enable (CKE).

Figure 6:
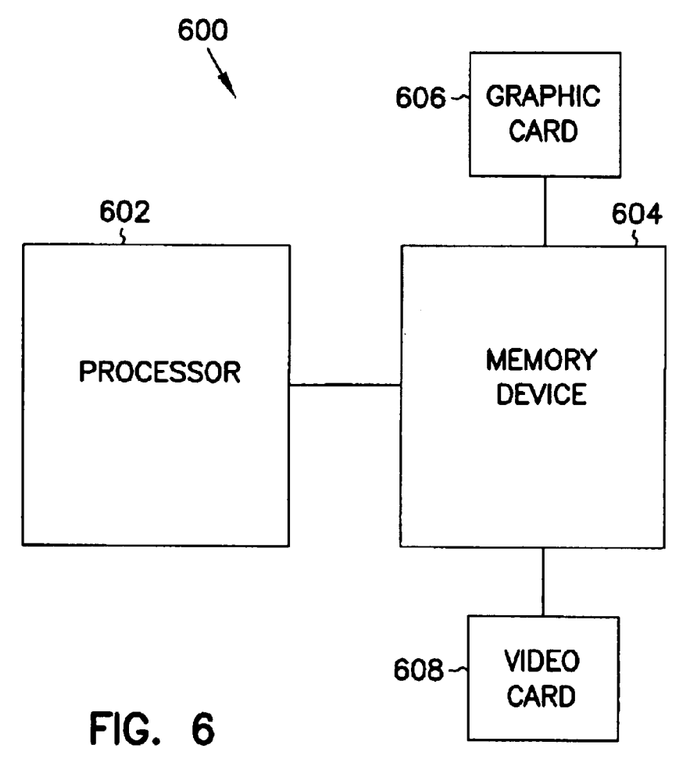
FIG. 6 illustrates an exemplary environment including memory device of the present invention.

FIG. 6 illustrates an embodiment of an exemplary environment of the invention. The embodiment includes a computer system 600 including one or more of the memory devices of the present invention. Computer 600 comprises a processor 602 connected to a memory device 604. Memory device 604 may be any of the memory devices of the invention described above. Memory device 604 is used for storing data or for other application within the system. Because of its high density, high bandwidth and reduced data access latency, memory device 604 can be used as random access memory of the computer system to improve the overall performance of the computer system. Memory device 604 can also improve the processing of graphic information or video information by storing more information and operating at reduced latency. Therefore memory device can be connected to a graphic control card 606 or a video control card 608 for use in processing graphic or video information.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefor, it is intended that this invention be limited only by the claims and the equivalents thereof.

What is claimed is:

1. A memory device comprising:
   a volatile main memory;
   a cache memory having a plurality of static registers connected to the volatile main memory;
   a plurality of register controllers, each of the register controllers being connected to one of the static registers; and
   a compression and decompression engine connected between the volatile main memory and the cache memory, wherein the volatile main memory, the cache memory, the plurality of register controllers, and the compression and decompression engine are located in a single chip.

2. The memory device of claim 1 further comprising, on the single chip, an error detection and correction engine connected to the volatile main memory and the compression and decompression engine.

3. A memory device comprising:

a dynamic memory;

a static memory having a plurality of static registers connected to the dynamic memory;

a plurality of register controllers, each of the register controllers being connected to one of the static resisters; and a compression and decompression engine connected between the dynamic memory and the static memory; and an error detection and correction engine connected to the dynamic memory and the compression and decompression engine, wherein the dynamic memory, the static memory, the plurality of register controllers, the compression and decompression engine, and the error detection and correction engine are located in a single chip.

4. The memory device of claim 3 wherein the error detection and correction engine is connected between the dynamic memory and the compression and decompression engine.

5. A memory device comprising:

an input/output buffer;

a cache memory having a plurality of static registers connected to the input/output buffer;

a plurality of register controllers, each of the register controllers being connected to one of the static registers; and a compression and decompression engine connected to the cache memory; and a volatile main memory connected to the compression and decompression engine, wherein the input/output buffer, the cache memory, the plurality of register controllers, the compression and decompression engine, and the volatile main memory and are located in a single chip.

6. The memory device of claim 5 wherein the compression and decompression engine is connected between the volatile main memory and the cache memory.

7. The memory device of claim 6 further comprising, on the single chip, an error detection and correction engine connected to the volatile main memory and the compression and decompression engine.

8. A system comprising:

a processor; and a memory device connected to the processor, the memory device comprising a volatile main memory, a compression and decompression engine connected to the volatile main memory, a plurality of static registers connected to the volatile main memory, and a plurality of register controllers, each of the register controllers being connected to one of the static registers, wherein the volatile main memory, the compression and decompression engine, the plurality of static registers, and the plurality of register controllers are located in a single chip.

9. The system of claim 8 wherein the memory device further comprises, on the single chip, an error detection correction engine connected to the compression and decompression engine.

10. A system comprising:

a processor; and a memory device connected to the processor, wherein the memory device comprises a dynamic random access memory array, a compression and decompression engine connected to the dynamic random access memory array, and a cache memory having a plurality of static registers connected to the compression and decompression engine, and a plurality of register controllers, each of the register controllers being connected to one of the static registers, wherein the dynamic random access memory array, the compression and decompression engine, the plurality of register controllers, and the cache memory and are located in a single chip.

11. The system of claim 10 wherein the memory device further comprises, on the single chip, an error detection correction engine connected to the compression and decompression engine.

12. The system of claim 10 further comprising a graphic control card, wherein the graphic control card connects to the memory device.

13. The system of claim 10 further comprising a video control card, wherein the video control card connects to the memory device.

14. A method of increasing a storage density of a memory device, the method comprising:

providing a volatile main memory;

providing a compression and decompression engine; and connecting the compression and decompression engine to the volatile main memory;

placing a plurality of static registers between on a data path between an input/output buffer and the compression and decompression engine;

connecting a plurality of register controllers to the static registers to control the static registers, wherein each of the register controllers is connected to one of the static registers, wherein the volatile main memory, the plurality of static registers, the plurality of register controllers, and the compression and decompression engine are located in a single chip.

15. The method of claim 14 further comprising:

providing an error detection and correction engine in the single chip; and connecting the error detection and correction engine to the compression and decompression engine.

16. A method of operating a memory device, comprising:

receiving input data at a plurality of static registers of a cache memory;

controlling the plurality of static registers with a plurality of register controllers, wherein each of the static registers is controlled by one of the register controllers;

compressing the input data at a compression and decompression engine to produce compressed data; and storing the compressed data into a volatile main memory, wherein the cache memory, the plurality of static registers, the compression and decompression engine, and the volatile main memory are located in a single chip.

17. The method of claim 16 further comprising:

reading the compressed data from the volatile main memory;

decompressing the compressed data at the compression and decompression engine to produced decompressed data; and reading the decompressed data to the cache memory.

18. A method of operating a memory device, comprising:

receiving data at an input/output buffer;

processing the data at a plurality of static registers of a cache memory to produce processed data;

controlling the plurality of static registers with a plurality of register controllers, wherein each of the static registers is controlled by one of the register controllers;

compressing the processed data at a compression and decompression engine to produce compressed data; and storing the compressed data into a volatile main memory, wherein the input/output buffer, the cache memory, the plurality of static registers, the compression and decompression engine, and the volatile main memory are located in a single chip.

19. The method of claim 18 further comprising:

reading the compressed data from the volatile main memory;

decompressing the compressed data at the compression and decompression engine to produced decompressed data;

reading the decompressed data at the cache memory; and transferring the data to the input/output buffer.

20. A memory device comprising:

an input/output buffer;

a static memory having a plurality of static registers connected to the input/output buffer;

a plurality of register controllers, each of the register controllers being connected to one of the static registers;

a compression and decompression engine connected to the static memory; and a dynamic memory connected to the compression and decompression engine, wherein the input/output buffer, the static memory, the plurality of static registers, the compression and decompression engine, and the dynamic memory and are located in a single chip.

21. The memory device of claim 20 further comprising, on the single chip, an error detection and correction engine connected to the dynamic memory and the compression and decompression engine.

22. A system comprising:

a processor; and a dynamic random access memory device connected to the processor, the dynamic random access memory device including a plurality of memory blocks, a compression and decompression engine connected to the memory blocks, a plurality of static registers, and a plurality of register controllers, each of the register controllers being connected to one of the static registers, wherein the memory blocks, the compression and decompression engine the plurality of static registers, and the plurality of register controllers are located in a single chip.

23. The system of claim 22 wherein the memory device further comprises, on the single chip, an error detection correction engine connected to the compression and decompression engine.

24. A system comprising:

a processor; and a memory device connected to the processor, the memory device including:

a plurality of dynamic memory blocks;

a compression and decompression engine connected to the dynamic memory blocks;

and a static memory block having a plurality of static registers connected to the compression and decompression engine;

a plurality of register controllers, each of the register controllers being connected to one of the static registers; and an error detection correction engine connected to the compression and decompression engine, wherein the dynamic memory blocks, the compression and decompression engine, the static memory block, the plurality of static registers, and the error detection correction engine are located in a single chip.

25. The system of claim 24 further comprising a graphic control card connected to the memory device.

26. The system of claim 25 further comprising a video control card connected to the memory device.

27. A method of operating on data comprising:

receiving input data;

passing the input data through a plurality of static registers;

controlling the plurality of static registers with a plurality of register controllers, wherein each of the static registers is controlled by one of the register controllers;

compressing the input data to produce compressed data;

storing the compressed data;

reading the compressed data; and decompressing the compressed data, wherein receiving, compressing, storing, reading, and decompressing are performed on a single chip.

28. The method of claim 27 further comprising:

detecting for an error during compressing and decompressing; and correcting the error during compressing and decompressing.

29. A method of operating on data comprising:

receiving input data at a plurality of static registers of a static memory block;

controlling the plurality of static registers with a plurality of register controllers, wherein each of the static registers is controlled by one of the register controllers;

compressing the input data to produce compressed data;

storing the compressed data into a dynamic memory block;

reading the compressed data from the dynamic memory block; and decompressing the compressed data, wherein receiving, compressing, storing, reading, and decompressing are performed on a single chip.

30. The method of claim 29 further comprising:

detecting for an error during compressing and decompressing; and correcting the error during compressing and decompressing.

31. A memory device comprising:

a dynamic memory;

a plurality of static registers connected to the dynamic memory;

a plurality of register controllers, each of the register controllers being connected to one of the static registers;

a compression and decompression engine connected to the dynamic memory and the plurality of static registers; and an error detection and correction engine connected to the dynamic memory and the compression and decompression engine, wherein the dynamic memory, the plurality of static registers, the plurality of register controllers, the compression and decompression engine, and the error detection and correction engine are located in a single chip.

32. The memory device of claim 31 further comprising an input/output buffer connected to the plurality of static registers.

33. The memory device of claim 31 wherein the dynamic memory includes a plurality of memory banks.

34. A system comprising:

a processor; and a memory device connected to the processor, the memory device including:

a dynamic memory;

a plurality of static registers connected to the dynamic memory;

a plurality of register controllers, each of the register controllers being connected to one of the static registers;

a compression and decompression engine connected to the dynamic memory and the plurality of static registers; and an error detection and correction engine connected to the dynamic memory and the compression and decompression engine, wherein the dynamic memory, the plurality of static registers, the plurality of register controllers, the compression and decompression engine, and the error detection and correction engine are located in a single chip.

35. The system of claim 34 further comprising a graphic control card connected to the memory device.

36. The system of claim 35 further comprising a video control card connected to the memory device.

37. A method comprising:

transferring input data to a plurality of static registers;

independently controlling the transferring of the input data at each of the static registers;

compressing the input data to produce compressed data;

storing the compressed data into a dynamic memory;

reading the compressed data from the dynamic memory; and decompressing the compressed data, wherein transferring, controlling, compressing, storing, reading, and decompressing are performed on a single chip.

38. The method of claim 37 further comprising:

detecting for an error during the compressing and the decompressing; and correcting the error during the compressing and the decompressing.

* * * * *